United States Patent [19]

Hill et al.

[11] 4,093,911

[45] June 6, 1978

[54] NUCLEAR MAGNETIC RESONANCE SPECTROMETER EMPLOYING AN IMPROVED RESONANCE SIGNAL GATING CIRCUIT

[75] Inventors: Howard D. W. Hill, Cupertino; John R. Laudermilch, Foster City, both of Calif.

[73] Assignee: Varian Associates, Inc., Palo Alto, Calif.

[21] Appl. No.: 770,479

[22] Filed: Feb. 22, 1977

[51] Int. Cl.² ............................................ G01R 33/08
[52] U.S. Cl. .............................. 324/.5 AH; 324/.5 R
[58] Field of Search ................ 324/.5 R, .5 A, .5 AC, 324/.5 AH

[56] References Cited

U.S. PATENT DOCUMENTS

| 3,039,048 | 6/1962 | Shoolery | 324/.5 R |
| 3,603,871 | 9/1971 | Caunter | 324/.5 R |
| 3,670,185 | 6/1972 | Vermette | 324/.5 R |

*Primary Examiner*—M. Tokar

*Attorney, Agent, or Firm*—Stanley Z. Cole; Gerald M. Fisher; Edward H. Berkowitz

[57] ABSTRACT

In a nuclear magnetic resonance spectrometer a gate is employed for time share multiplexing of the resonance and transmitter signals. An improved gate circuit is connected in series between the receiver and the resonance detecting circuit employed for picking up resonance of the sample. The improved gate circuit includes a pair of parallel connected branches of PIN diodes connected between the input and output terminals of the gate. The diodes in each parallel branch are poled toward an intermediate control node in such a manner so that a positive control potential applied to the control of one branch node turns that branch on and conversely a negative control potential applied to the other control node turns on the other branch. Equal magnitude and opposite sign control pulses are applied to the control nodes so that transient switching signals, tending to leak through the gate, cancel on the output line to the RF receiver.

3 Claims, 2 Drawing Figures

NUCLEAR MAGNETIC RESONANCE SPECTROMETER EMPLOYING AN IMPROVED RESONANCE SIGNAL GATING CIRCUIT

BACKGROUND OF THE INVENTION

The present invention relates in general to nuclear magnetic resonance spectrometers and more particularly to such spectrometers employing a time sharing multiplexed resonance exciting and sensing circuit.

DESCRIPTION OF THE PRIOR ART

Heretofore, nuclear magnetic resonance spectrometers have employed a time share multiplexed pick-up coil for exciting and sensing resonance of the sample under analysis. In such a system, a single RF coil, coupled in RF magnetic field exchanging relation with the sample under analysis, is first time shared with the output of a radio frequency transmitter for applying a transmitter pulse to the sample under analysis for exciting resonance. During the time the transmitter is ON a gate circuit, connected between the RF coil and the RF receiver, is gated OFF so that the transmitter pulses are not fed into the receiver.

In the prior art gating circuit, there was a first gate connected between the RF transmitter and the connection to the RF exciting coil and a second gate connected between the connection to the RF sensing coil and the RF receiver. The gates each comprised a parallel connection of reverse poled diodes so that in the presence of the strong transmitter signal the diodes were turned ON. The distance between the RF receiver and the connection to the probe was dimensioned to be approximately a quarter of a wavelength so that in the presence of the transmitter pulse a short to ground via the gate was provided by the RF switch ON receiver gate. This reflected a high impedance to the probe connection, thereby automatically isolating the receiver from the probe during the duration of the strong transmitter pulse.

The probe with this arrangement is that it depends upon a precise quarter wave spacing between the receiver gate and the probe connection which is achievable only if the spectrometer is designed to operate at a fixed frequency. In the case of a wide tunable range magnetic resonance spectrometer, the quarter wave spacing will not hold for all frequencies and therefore the prior switching arrangement is impractical.

Thus, there is a requirement for an improved gating circuit for use in a nuclear magnetic resonance spectrometer of the type which is tunable over a relatively wide band.

SUMMARY OF THE PRESENT INVENTION

The principal object of the present invention is the provision of an improved nuclear magnetic resonance spectrometer of the type employing gating of the resonance signal to the receiver circuit.

In one feature of the present invention, a gate circuit between the resonance pick-up circuit and the receiver includes a parallel connection of two branches, each branch including a series connection of two diodes with a control node in each branch disposed between each of the diodes. The polarity of the diodes relative to the control node in each branch being opposite so that a positive control potential applied to one control node renders that branch conductive, whereas a negative pulse applied to the other branch renders that branch conductive. In this manner, equal and opposite control pulses applied to the control nodes controls operation of the gate circuit, whereby transient switching signals, occasioned by operation of the gate, cancel at the output to the receiver.

Other features and advantages of the present invention will become apparent upon a perusal of the following specification taken in connection with the accompanying drawings wherein:

DESCRIPTION OF THE PREFERRED EMBODIMENTS

Figure 1:
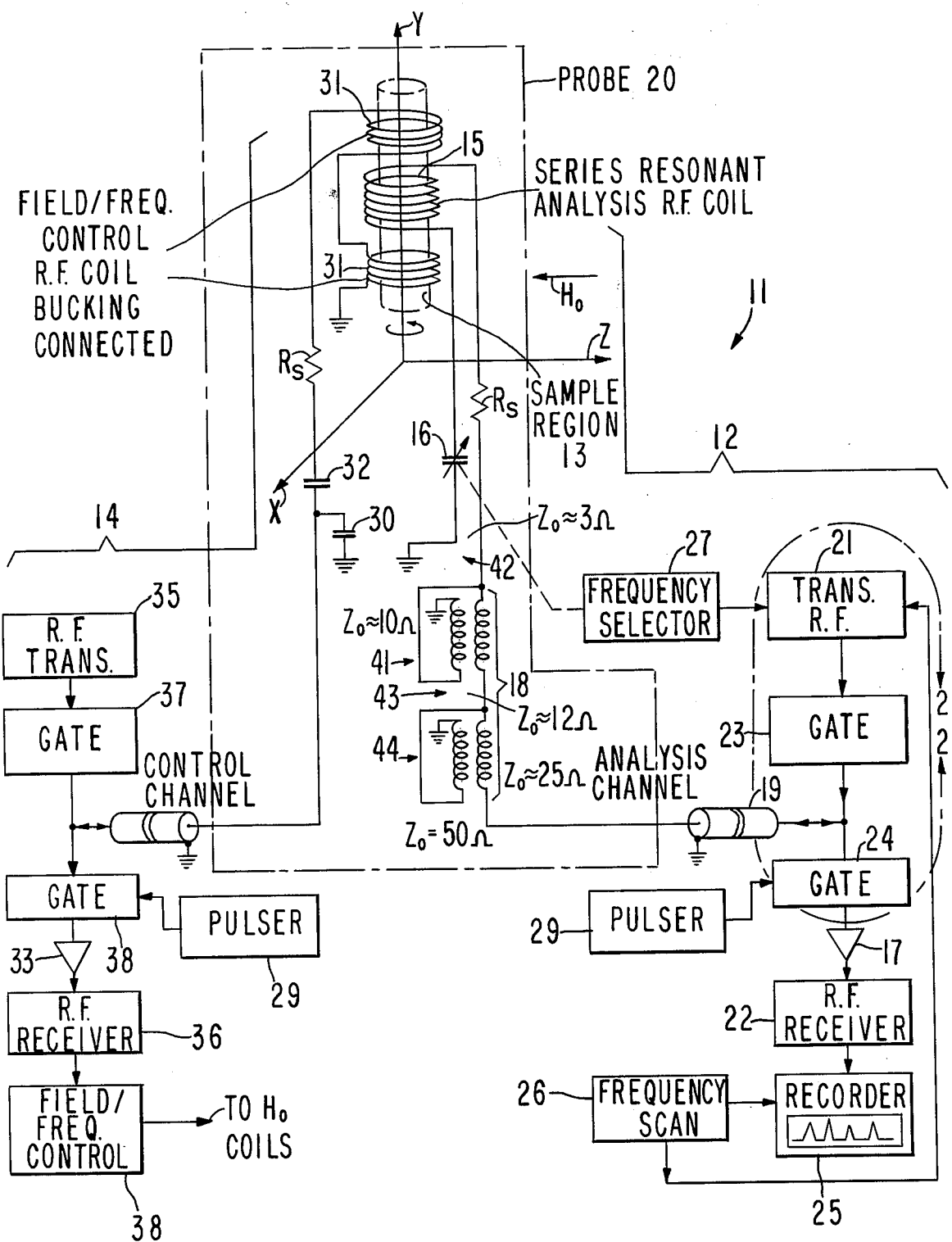
FIG. 1 is a schematic circuit diagram, partly in block diagram form, of a nuclear magnetic resonance spectrometer incorporating features of the present invention.

Referring now to FIG. 1 there is shown a wide tuning range nuclear magnetic resonance spectrometer 11 incorporating features of the present invention. The spectrometer 11 includes an analysis channel portion 12 for exciting and detecting nuclear magnetic resonance of a sample under analysis disposed within a tubular sample region 13 and a field frequency control channel 14 for exciting and detecting resonance of a control group of nuclear resonance bodies for controlling the resonance condition of the sample under analysis.

The sample under analysis within the sample region 13 is disposed in RF magnetic field exchanging relation with an RF magnetic pick-up coil 15, as of 1.6$\mu$h inductance comprising 14 turns of approximately 10 millimeter diameter, the coil being approximately 9 millimeters long. The coil 15 is series resonated with a variable capacitor 16 having a capacitance variable between a value of approximately 10 pf to a value of approximately 400 pf for tuning the series resonance of the RF pick-up coil 15 over a relatively wide tuning range, as of from 6 megahertz to 32 megahertz. The series resonant pick-up coil 15 includes a certain amount of resistance which appears as a series resistance $R_s$. In a typical example, the series resistance $R_s$ is approximately 3 ohms. The Q of the series tuned resonance circuit has a value of approximately 50.

The pick-up analysis coil 15 is wound around the sample region 13 with a magnetic axis parallel to the Y axis in the Cartesian set of coordinates, as shown. The sample is preferably spun by means of a conventional spinner with the axis of revolution being parallel to the Y axis. A polarizing magnetic field $H_0$, as of 18 kilogauss, is directed through the sample region 13 parallel to the Z axis. The series resonant analysis RF pick-up coil 15 is coupled to the input of an RF preamplifier 17 via the intermediary of a two stage transmission line impedance transformer 18 for matching the relatively low series resonant impedance, as of 1.5 to 5 ohms, of the series resonant pick-up coil to the input impedance of the amplifier 17, as of 50 ohms.

The transformer 18 and coil 15 are preferably disposed within a probe housing 20 disposed between the pole pieces of a magnet utilized for producing the polarizing field $H_0$. The output of the transformer 18 is coupled via a length of 50 ohm coaxial line 19 to a connection between an RF transmitter 21 and the RF preamplifier 17 and between respective gates 23 and 24. The RF preamplifier 17 feeds its output into an RF receiver 22 which receives the nuclear magnetic resonance signal picked up by the pick-up coil 15 and detects the preamplified received signal to produce a DC output resonance signal proportional to the amplitude of the detected resonance of the sample under analysis. The DC resonance signal is fed to a recorder 25 for recording as a function of frequency of the transmitter 21 which is scanned by means of a frequency scan output derived from frequency scanner 26 so that the output of the recorder is a recorded nuclear magnetic resonance spectrum of the sample under analysis.

One output of the frequency scan 26 is employed for controlling the frequency of the RF transmitter 21 for scanning the frequency of the RF transmitter 21 over a certain narrow range of frequencies, as of a few thousand hertz centered about the center frequency of the RF transmitter. The center frequency $f_0$ of the RF transmitter 21 is also tuned to the frequency bands of the several different nuclei under analysis falling within a frequency range of 6 to 32 megahertz. For example, a frequency selector 27 permits selection of a center frequency for the RF transmitter 21 of approximately 6 megahertz for the nuclei of $^{14}N$; 8 megahertz for the nuclei of $^{15}N$; 12 megahertz for the nuclei of $^2H$ 20 megahertz for the nuclei of $^{13}C$ and 32 megahertz for the nuclei of $^{31}P$. The frequency selector 27 also includes a tuning control for tuning the value of capacitor 16 for tuning the series resonant frequency of the series tuned pick-up coil 15 to the respective nuclear magnetic resonance frequencies of the aforecited nuclei.

The nuclear magnetic resonance spectrometer 11 is a spectrometer of the single coil type, that is, a common RF coil 15 serves both as the coil for applying the nuclear magnetic resonance exciting field to the sample under analysis and for picking up the resultant nuclear resonance of the sample. This is accomplished by time share multiplexing the transmitter 21 and the receiver 22 so that the transmitter sends out a pulse for exciting the resonance and then during an off period, the receiver 22 is gated on for receiving the resonance signal emanating from the excited sample under analysis.

The transmitter gate 23 may comprise a pair of parallel connected reverse poled diodes such that when the amplitude of the RF transmitter pulse exceeds a predetermined threshold value the pulse passes through the transmitter gate 23 by turning on the diodes and thence passes through the gate 23 to the coil 15.

A pulser 29, synchronized with the RF transmitter 21, preferably is employed for pulsing the receiver gate 24 on during the off times of the RF transmitter so that resonance signals picked up in the pick-up coil 15 pass through the receiver gate 24 to the preamplifier 17 and receiver 22, but strong RF transmitter pulses are blocked from the preamplifier 17 and receiver 22.

The field frequency control channel 14 includes means for exciting and detecting resonance of a control group of nuclear magnetic resonance bodies disposed within the sample region 13 to derive a signal for controlling the magnitude of the polarizing field $H_0$ to a predetermined value related to the resonance frequency of the known field frequency control sample. More particularly, the field frequency control channel 14 includes an RF exciting and detecting coil 31 coaxially disposed of the sample of the analysis coil 15 with the coil 31 being axially separated into two equal portions disposed at opposite ends of the analysis coil 15. The coil portions 31 are oppositely wound relative to the series current flow therethrough so that the RF fields produced by said separate portions cancel in the region bounded by the analysis coil 15. This is accomplished, in one embodiment, by causing the two halves of the field frequency RF coil 31 to be bucking wound so that the RF magnetic field generated in each half cancels in the center of the analysis coil 15. The field frequency RF coil 31 is tuned and impedance matched to 50 Ω by means of capacitors 30 and 32 at the nuclear magnetic resonant frequency of the control group of nuclei.

The tuned field frequency control coil 31 is coupled via a coaxial line 34 to a node between a control RF transmitter 35 and a control RF preamplifier 33 and receiver 36 and between respective gates 37 and 38. The gates 37 and 38 operate in the same manner as gates 23 and 24 for time share multiplexing the transmitter pulses to the received pulses from the control group of nuclear magnetic resonators.

The DC resonance signal derived from the output of the control RF receiver 36 is fed to a field frequency controller 38 to derive an output for driving a set of electromagnetic coils, not shown, used to control the total magnitude of the magnetic field $H_0$. The field frequency control signal derived from field frequency controller 38, has a magnitude and sign so as to sustain resonance of the field/frequency control group of nuclear magnetic resonators so that the intensity of the polarizing magnetic field $H_0$ is locked to the resonance of the control group of nuclear magnetic resonators. A pulser 29 drives the receiver gate 38 so as to gate on the receiver during the off time of the RF transmitter 35.

Figure 2:
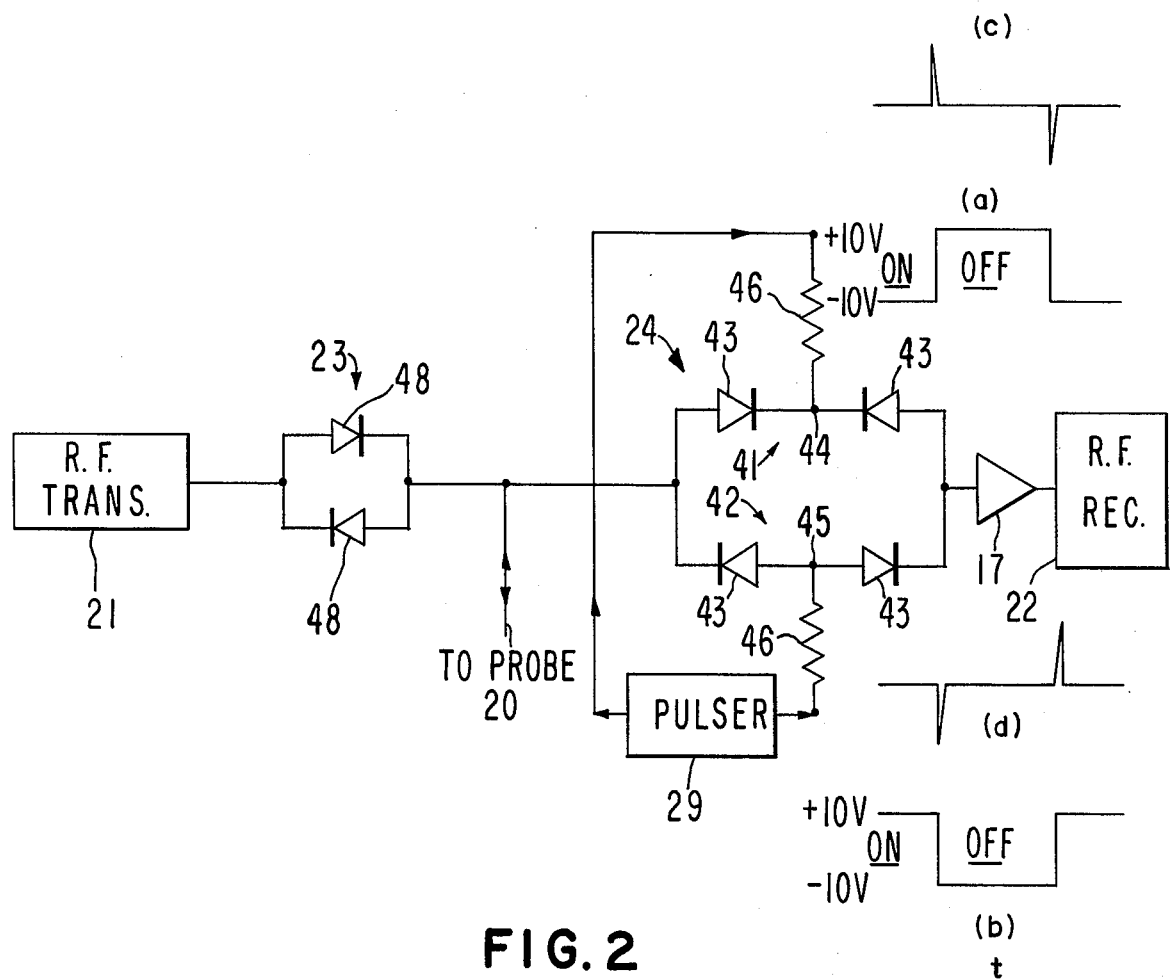
FIG. 2 is a detailed view of a portion of the circuit of FIG. 1 delineated by line 2—2 and depicting the gating circuit of the present invention.

Referring now to FIG. 2 there is shown the gating circuit for gating the signals picked up by the resonance detecting circuit in the probe 20 to the preamplifier 17 and receiver 22. The gate circuit 24 includes a pair of parallel branches 41 and 42 each branch consisting of a series connection of PIN diodes 43 with a respective control node 44 or 45 connected in between each of the pairs of diodes to the pulser 29 via RF isolating resistors 46. The diodes 43 in the first parallel branch 41 are poled relative to the control node 44 so that a positive going pulse shown as waveform (a) serves to bias the diodes into the nonconductive mode (OFF) whereas a negative going potential applied to control node 44 renders the diodes in branch 41 conductive. Conversely, the diodes in the second branch 42 are poled relative to its control node 45 so that a negative going pulse shown by waveform (b) biases the diodes 43 in the second branch 42 nonconductive or into the OFF mode.

The pulser 29 serves to provide control pulses of equal and opposite sign as shown in waveforms (a) and (b) to the respective control nodes 44 and 45 for biasing the gate 24 ON and OFF. In this manner, switching transients tending to leak through the gate 24 into the input of the preamplifier 17 and RF receiver 22 cancel, as shown in waveforms (c) and (d) by producing equal and opposite transients in the input to the preamplifier 17 and receiver 22 so that switching transients are not coupled into the preamplifier 17 and receiver 22. The transmitter gate 23 merely comprises a parallel connection of oppositely poled diodes 48 which are turned ON when the RF transmitter voltage exceeds a predetermined threshold value.

What is claimed is:

1. In a nuclear magnetic resonance spectrometer of the type having a probe circuit means disposed in radio frequency magnetic field exchanging relation with a sample region for containing a group of nuclear magnetic resonators for exciting and detecting resonance of the group of nuclear magnetic resonators, receiver means for receiving and amplifying the resonance signals coupled into said probe circuit means from the resonant group of nuclear magnetic resonators, and a gate circuit means, disposed in circuit with said probe circuit means and said receiver means for gating ON and OFF the flow of electrical signals between said probe circuit means and said receiver means, the improvement wherein:

said gate circuit means includes first and second gate circuit branch means parallel connected to each other and between said probe circuit means and said receiver means, each of said first and second gate circuit branch means including a series connection of a pair of gating diode means, a control node means connected in between each pair of gating diode means for application of a control potential to respective ones of said diode means for biasing said diode means between conductive and nonconductive modes of operation for gating ON and OFF the flow of signals between said probe circuit means and said receiver means; and said diode means of said first and second parallel branches being oppositely poled relative to their respective control node means such that transient feedthrough of biasing pulse signals of equal magnetic and opposite sign cancel each other on the signal line gated ON and OFF by said gate means.

2. The apparatus of claim 1 wherein said gate diode means comprise PIN diodes.

3. The apparatus of claim 1 including gating pulse generator means for generating said pair of gating pulses of equal magnitude and opposite sign for application to said control node means.

* * * * *